United States Patent [19]

Nakahara et al.

[11] Patent Number: 5,414,387
[45] Date of Patent: May 9, 1995

[54] DISTRIBUTED AMPLIFIER AND BIDIRECTIONAL AMPLIFIER

[75] Inventors: Kazuhiko Nakahara; Yoshinobu Sasaki, both of Itami, Japan

[73] Assignee: Mitsubishi Denki Kabushiki Kaisha, Tokyo, Japan

[21] Appl. No.: 258,831

[22] Filed: Jun. 13, 1994

[30] Foreign Application Priority Data

Jul. 14, 1993 [JP] Japan ................................ 5-173907

[51] Int. Cl.⁶ ............................................. H03F 3/60
[52] U.S. Cl. ..................................... 330/54; 330/286
[58] Field of Search ............... 330/54, 277, 286, 295

[56] References Cited

U.S. PATENT DOCUMENTS 4,973,918  11/1990  Schindler ........................ 330/277
5,046,155   9/1991  Beyer et al. ....................... 330/54

FOREIGN PATENT DOCUMENTS 0220403   5/1987  European Pat. Off. ............. 330/54
1205458   8/1989  Japan .

OTHER PUBLICATIONS

IEEE 1990 Microwave and Millimeter-Wave Monolithic Circuits Symposium, "A Single Chip 2–20 GHz T/R Module", pp. 99–102, Schindler et al.

*Primary Examiner*—Steven Mottola
*Attorney, Agent, or Firm*—Leydig, Voit & Mayer

[57] ABSTRACT

A distributed amplifier includes an input side circuit including a plurality of distributed constant lines connected in series between an input terminal and ground and a plurality of source-grounded FETs for switching operation having drains connected to respective junctions of the distributed constant lines, an output side circuit including a plurality of distributed constant lines connected in series between an output terminal and ground, and a plurality of source-grounded amplifier FETs having gates connected to respective junctions of the distributed constant lines of the input side circuit via capacitors and drains connected to junctions of the distributed constant lines of the output side circuit. In this structure, since the input side circuit also serves as a distributed switch, when a T/R module is fabricated using the distributed amplifier, it is not necessary to add a distributed switch for controlling signal input and output, so that the chip size of the T/R module is reduced compared to the conventional T/R module. In addition, the signal transmission loss is reduced.

12 Claims, 7 Drawing Sheets

DISTRIBUTED AMPLIFIER AND BIDIRECTIONAL AMPLIFIER

FIELD OF THE INVENTION

The present invention relates to a distributed amplifier and a bidirectional amplifier including the distributed amplifier.

BACKGROUND OF THE INVENTION

Figure 7:
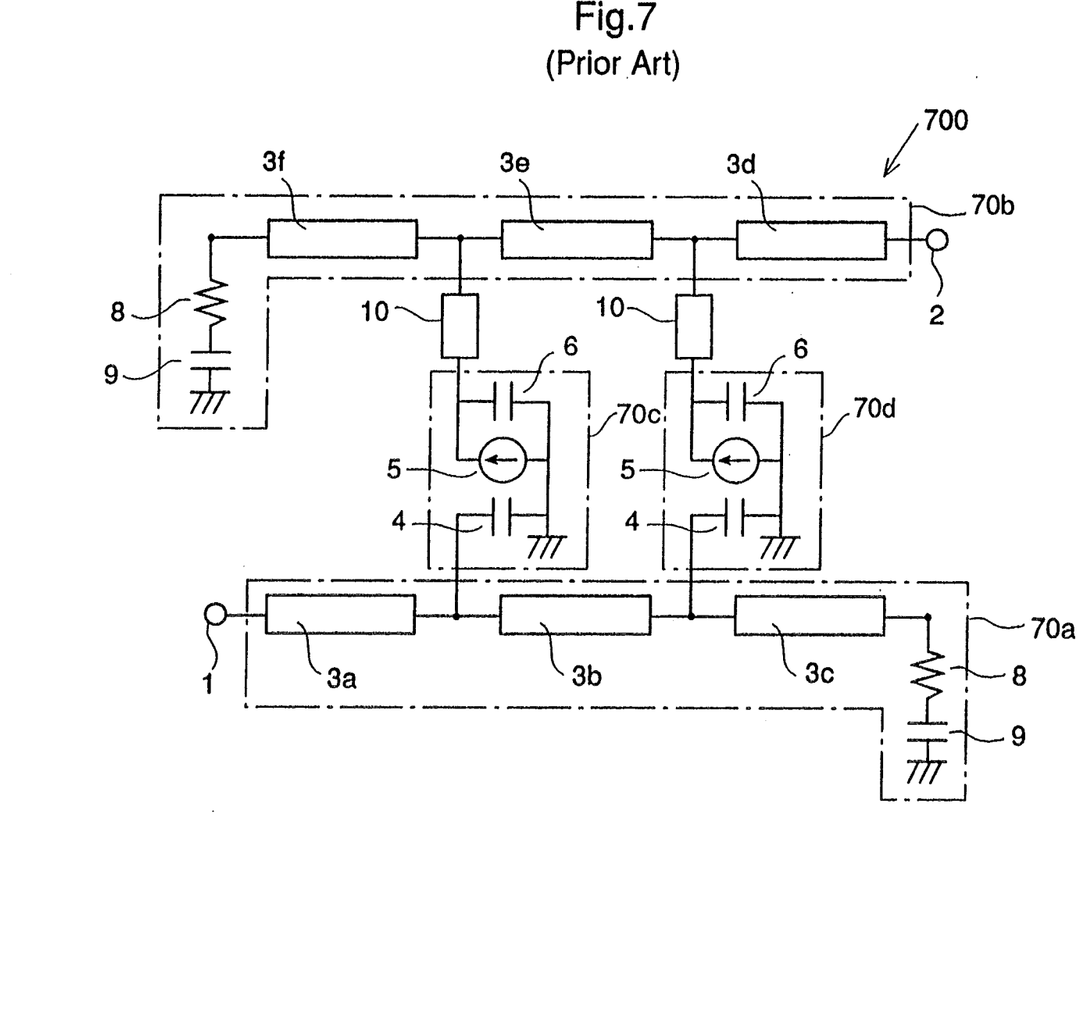
FIG. 7 is a circuit diagram illustrating a distributed amplifier in accordance with the prior art.

FIG. 7 is a circuit diagram illustrating a structure of a prior art distributed amplifier. In FIG. 7, a distributed amplifier 700 comprises an input side circuit 70a connected between an input terminal and ground, an output side circuit 70b connected between an output terminal 2 and ground, and source-grounded FETs 70c and 70d connected between the input circuit 70a and the output circuit 70b. The input side circuit 70a comprises three distributed constant lines 3a to 3c, a terminal resistor 8 of 50 Ω, and a bypass capacitor 9 which are connected in series between the input terminal 1 and ground. The output side circuit 70b comprises three distributed constant lines 3d to 3f, a terminal resistor 8 of 50 Ω, and a bypass capacitor 9 which are connected in series between the output terminal 2 and ground. The source-grounded FET 70c includes a gate connected to the junction of the input side distributed constant lines 3a and 3b and a drain connected to the junction of the output side distributed constant lines 3e and 3f via a distributed constant line 10. The source-grounded FET 70c includes a gate connected to the junction of the input side distributed constant lines 3b and 3c and a drain connected to the junction of the output side distributed constant lines 3d and 3e via a distributed constant line 10.

Each of the source-grounded FETs 70c and 70d is illustrated as an equivalent circuit comprising a gate-to-source capacitance 4, a current supply 5 controlled by a gate bias voltage, and a drain-to-source capacitance 6.

In the distributed amplifier 700, if the distributed constant lines 3a to 3c of the input side circuit 70a on the gate side of the source-grounded FET 70c (70d) are regarded as an inductance (Lg), the gate-source capacitance (Cgs) 4 of the FET and the inductance (Lg) form a circuit equivalent to a distributed constant line on the gate side of the FET. Similarly, if the distributed constant line 10 connected to the drain of the source-grounded FET 70c (70d) is regarded as an inductance (Ld), the drain-source capacitance (Cds) 6 of the FET and the inductance (Ld) form a circuit equivalent to a distributed constant line on the drain side of the FET.

A description is given of the operation.

Assuming that the input or output side characteristic impedance is Zo, the following equation (3) applies to the gate side of the source-grounded FET 70c (70d).

$$Zo = \sqrt{\frac{jWLg}{jWCgs}} = \sqrt{\frac{Lg}{Cgs}} \quad (3)$$

In this case, the cut-off frequency fc is represented by $$fc = \frac{1}{2\pi \sqrt{LC}} \quad (4)$$

The same relationship as described above applies to the drain side of the FET. Further, the input signal is amplified by the FET.

As described above, this distributed amplifier 700 is a broadband amplifier that can be used at frequencies up to the cut-off frequency.

When a Transmit/Receive (hereinafter referred to as T/R) module is fabricated using the prior art distributed amplifier 700, two distributed amplifiers 700 serving as a transmitter and a receiver, respectively, are required and, in addition, a T/R switch having a frequency band as wide as or wider than that of the distributed amplifier is required for switching the signal input-output path between the transmitter and the receiver. Therefore, if a T/R module is fabricated using the prior art distributed amplifiers 700, the chip size of the T/R module is unfavorably increased by the T/R switch. Further, the signal transmission loss due to the T/R switch must be considered.

SUMMARY OF THE INVENTION

It is an object of the present invention to provide a distributed amplifier including a switch.

It is another object of the present invention to provide a small-sized bidirectional amplifier.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a distributed amplifier comprises an input side circuit including a plurality of distributed constant lines connected in series between an input terminal and ground, and a plurality of source-grounded FETs for switching and having drains connected to junctions between the distributed constant lines of the input side circuit; an output side circuit including a plurality of distributed constant lines connected in series between an output terminal and ground; and a plurality of source-grounded amplifier FETs each having a gate connected to a junction of the distributed constant lines of the input side circuit via a capacitor and a drain connected to a junction of the distributed constant lines of the output side circuit. In this structure, since the input side circuit also serves as a distributed switch, when a T/R module is fabricated using the distributed amplifier, no additional distributed switch for controlling signal input and output is needed, so that the chip size of the T/R module is reduced compared to the conventional T/R module. In addition, signal transmission loss is reduced.

According to a second aspect of the present invention, a bidirectional amplifier comprises first and second distributed amplifiers having the same structure as described above, and first and second SPDT (Single Pole Double Throw) switches each having first, second, and third terminals wherein an input signal applied to the first terminal is output from one of the second and third terminals, or one of two input signals respectively applied to the second and third terminals is output from the first terminal. One of the second and third terminals of the first SPDT switch is connected to an input terminal of the first distributed amplifier and the other is connected to an output terminal of the second distributed amplifier. One of the second and third terminals of the second SPDT switch is connected to an output terminal of the first distributed amplifier and the other is connected to an input terminal of the second distributed amplifier. The first terminals of the first and second SPDT switches are input-output terminals of the whole circuit. In this structure, since the bidirectional amplifier is fabricated using only two distributed amplifiers and two SPDT switches with no additional distributed switch, the chip size of the amplifier is reduced compared to the conventional bidirectional amplifier, and the signal transmission loss is reduced.

According to a third aspect of the present invention, a bidirectional amplifier comprises first and second SPDT switches having the same structure as described above and a distributed amplifier. The distributed amplifier comprises a plurality of dual gate FETs for amplification each having first and second gates, a source, and a drain, first and second input side circuits having the same structure as described above respectively connected to the first gates and the second gates of the dual gate FETs, and first and second output side circuits having the same structure as described above and respectively connected to the sources and the drains of the dual gate FETs. The second terminal of the first SPDT switch is connected to an input terminal of the first input side circuit, and the third terminal is connected to an output terminal of the first output side circuit. The second terminal of the second SPDT switch is connected to an input terminal of the second input side circuit, and the third terminal is connected to an output terminal of the second output side circuit. The first terminals of the first and second SPDT switches are input-output terminals of the whole circuit. In this structure, since the bidirectional amplifier is fabricated using only one distributed amplifier and two SPDT switches with no additional distributed switch, the chip size of the amplifier is reduced compared to the conventional bidirectional amplifier, and the signal transmission loss is reduced.

DETAILED DESCRIPTION OF THE PREFERRED EMBODIMENTS

Figure 1:
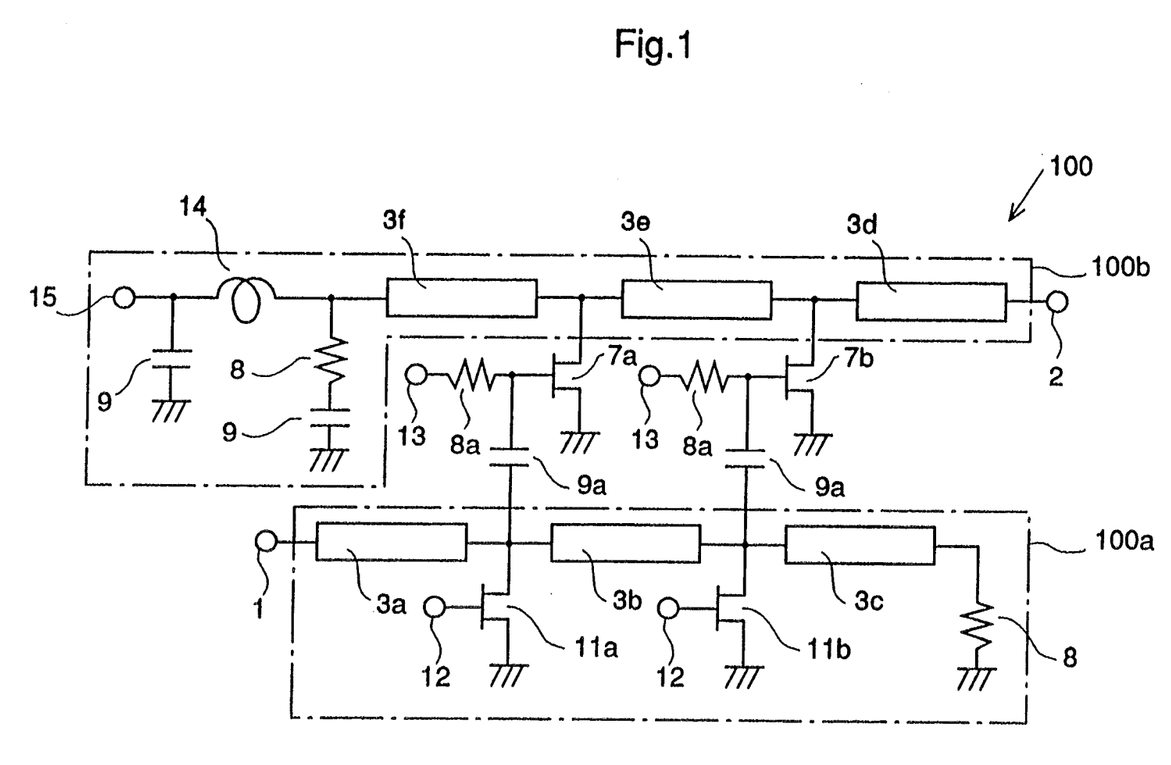
FIG. 1 is a circuit diagram illustrating a distributed amplifier in accordance with a first embodiment of the present invention.

FIG. 1 is a circuit diagram illustrating a distributed amplifier in accordance with a first embodiment of the present invention. In FIG. 1, the same reference numerals as in FIG. 7 designate the same or corresponding parts. A distributed amplifier 100 comprises an input side circuit 100a connected between an input terminal 1 and ground, an output side circuit 100b connected between an output terminal 2 and ground, and source-grounded FETs 7a and 7b connected between the input side circuit 100a and the output side circuit 100b.

The source-grounded FETs 7a and 7b are amplifier FETs. The FET 7a includes a gate connected through a capacitor 9a to the junction of the distributed constant lines 3a and 3b of the input side circuit 100a and a drain connected to the junction of the distributed constant lines 3e and 3f of the output side circuit 100b. A gate bias terminal 13 is connected through a resistor 8a to the junction of the gate of the FET 7a and the capacitor 9a. The FET 7b includes a gate connected through a capacitor 9a to the junction of the distributed constant lines 3b and 3c of the input side circuit 100a and a drain connected to the junction of the distributed constant lines 3d and 3e of the output side circuit 100b. A gate bias terminal 13 is connected through a resistor 8a to the junction of the gate of the FET 7b and the capacitor 9a.

The input side circuit 100a includes three distributed constant lines 3a to 3c and a terminal resistor 8 which are connected in series between the input terminal 1 and ground, and two source-grounded FETs 11a and 11b. A drain of the source-grounded FET 11a is connected to the junction of the distributed constant lines 3a and 3b, and a drain of the source-grounded FET 11b is connected to the junction of the distributed constant lines 3b and 3c. The distributed constant lines 3a to 3c and the FETs 11a and 11b form a distributed switch. A gate bias terminal 12 is connected to a gate of each FET.

The output side circuit 100b includes three distributed constant lines 3d to 3f, a terminal resistor 8, and a bypass capacitor 9 which are connected in series between an output terminal 2 and ground. In addition, a drain bias terminal 15 for the source-grounded FETs 7a and 7b is connected through an RF choke coil 14 to the junction of the terminal resistor 8 and the distributed constant line 3f, and a bypass capacitor 9 is inserted between ground and the junction of the drain bias terminal 15 and the RF choke coil 14.

A description is given of the operation.

Since the source and the drain of the source-grounded. FET 11a (11b) are set at the same voltage by the terminal resistor 8, switching operation is possible in response to a bias voltage applied to the gate bias terminal 12. When the source-grounded FETs 11a and 11b are turned off, the distributed switch is turned on, and an input signal is input to the amplifier by the input side circuit 100a, the distributed amplifier 100 operates as the prior art distributed amplifier 700. On the other hand, when the source-grounded FETs 11a and 11b are turned on, the distributed switch is turned off, and no input signal is input to the amplifier by the input side circuit 100a.

The source-grounded FET 11a (11b) in the ON state has no resistance and the FET in the OFF state becomes a capacitance (CT). The capacitance (C) of the capacitor 9 connected to the drain of the FET 11a (11b) has the relation of $C >> CT, Cgs$.

When the FETs 11a and 11b are turned off, i.e., when the distributed switch is turned on, the parameters C, CT, and Cgs are designed so that the input side impedance Zo represented by the following equation (5) is 50 Ω, whereby the distributed amplifier 100 operates in the same manner as the prior art amplifier 700.

$$Z_0 = \sqrt{\dfrac{L_g}{\dfrac{C_{gs} \cdot C}{C_{gs} + C} + CT}} \quad (5)$$

When the FETs 11a and 11b are turned on, i.e., when the distributed switch is turned off, the input side impedance Z must satisfy the following equation (6) so that no signal is input to the amplifier from the input side circuit 100a. For this purpose, it is necessary to design the FETs 11a and 11b and the capacitors 9 so that the respective parameters C, CT, and Cgs have the relation of Cgs.C/(Cgs+C)>>CT so that equation (5) becomes $$Z = \sqrt{\dfrac{L_g}{\dfrac{C_{gs} \cdot C}{C_{gs} + C}}} >> Z_0 \quad (6)$$

As described above, in the distributed amplifier 100 according to the first embodiment of the present invention, the input side circuit 100a serves both as an amplifier and a switch for determining whether a signal is input to the distributed amplifier 100. Therefore, when a T/R module is fabricated using this distributed amplifier 100, no additional distributed switch is needed, so that the chip size of the T/R module is reduced compared to the prior art. Further, it is not necessary to consider the signal transmission loss due to the distributed switch, so that the design of the T/R module is simplified.

Figure 2:
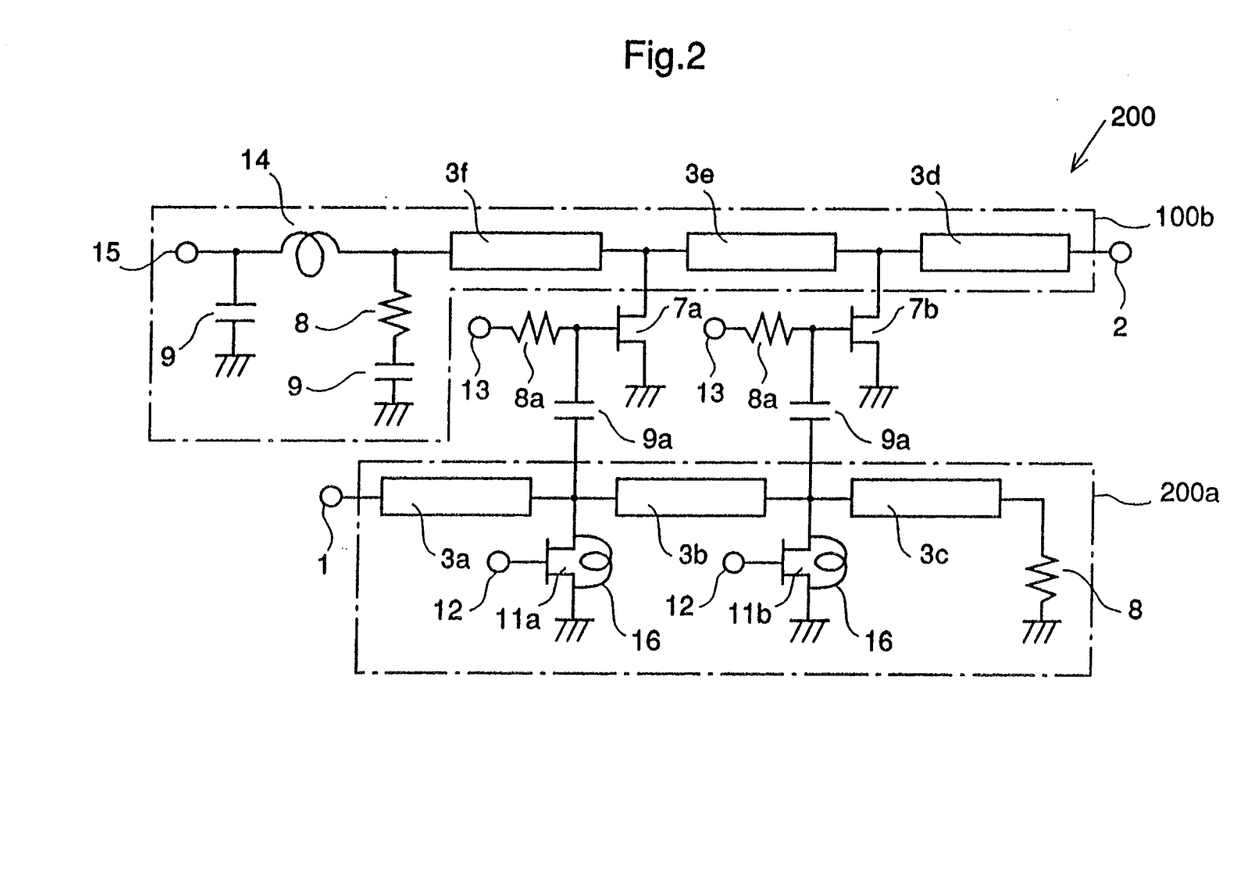
FIG. 2 is a circuit diagram illustrating a distributed amplifier in accordance with a second embodiment of the present invention.

FIG. 2 is a circuit diagram illustrating a distributed amplifier in accordance with a second embodiment of the present invention. In FIG. 2, the same reference numerals as in FIG. 1 designate the same or corresponding parts. The structure of the distributed amplifier 200 of this second embodiment is fundamentally identical to that of the first embodiment except that an inductor 16 is connected between the source and the drain of each of the source-grounded FETs 11a and 11b included in the input side circuit.

Assuming that the inductance of the inductor 16 is L, the working frequency (fo) is represented by $$f_o = \dfrac{1}{2\pi \sqrt{L\left(\dfrac{C_{gs} \cdot C}{C_{gs} + C}\right) + G}} \quad (7)$$

and if the inductance L of the inductor 16 is designed so that the working frequency fo is a desired value, this distributed amplifier 200 is operable in a narrow band.

Figure 3:
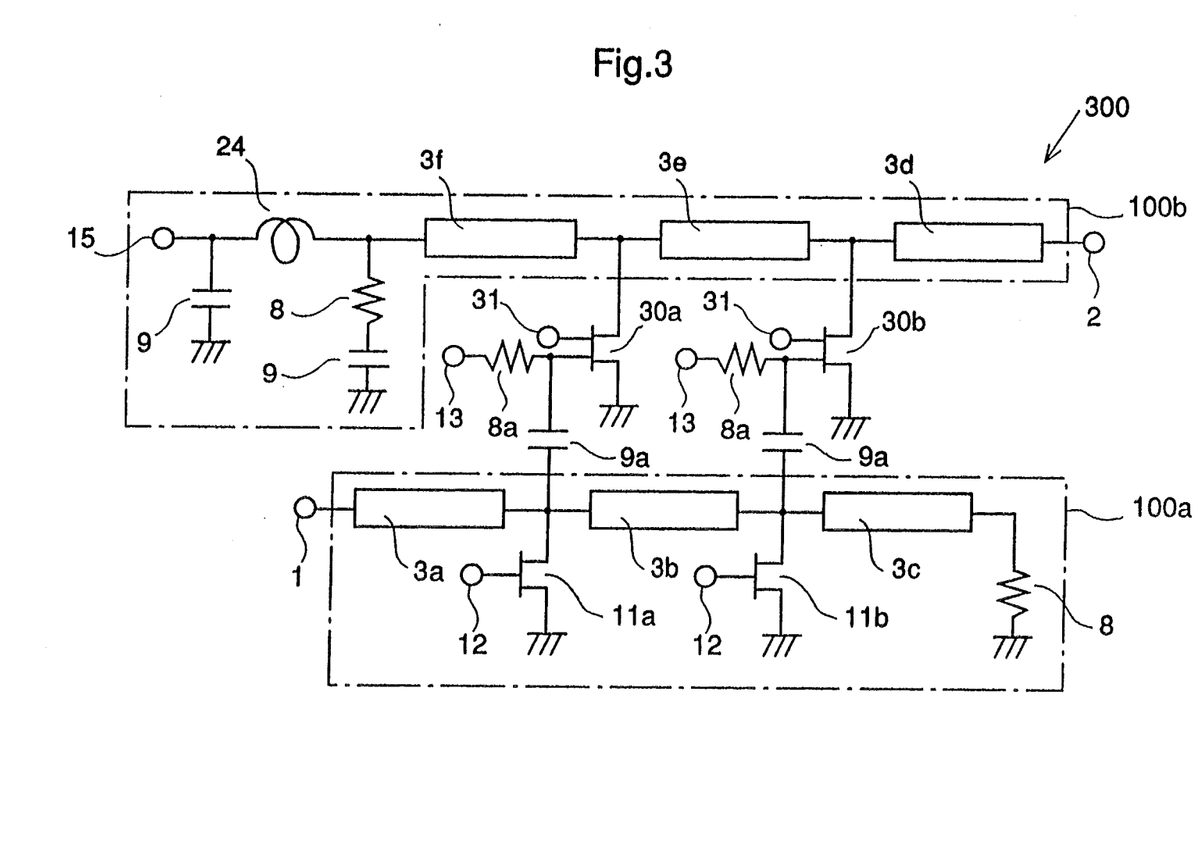
FIG. 3 is a circuit diagram illustrating a distributed amplifier in accordance with a third embodiment of the present invention.

FIG. 3 is a circuit diagram illustrating a distributed amplifier in accordance with a third embodiment of the present invention. In FIG. 3, the same reference numerals as in FIG. 1 designate the same or corresponding parts. A distributed amplifier 300 of this third embodiment employs dual gate FETs 30a and 30b for amplification in place of the FETs 7a and 7b of the distributed amplifier 100 of the first embodiment, and a gate bias terminal 31 for controlling gain is connected to one of two gates of each of the dual gate FETs. In this structure, since the gain of the amplifier is controlled by the bias voltage applied to the dual gate FETs 30a and 30b, a high-performance distributed amplifier is achieved.

Figure 4:
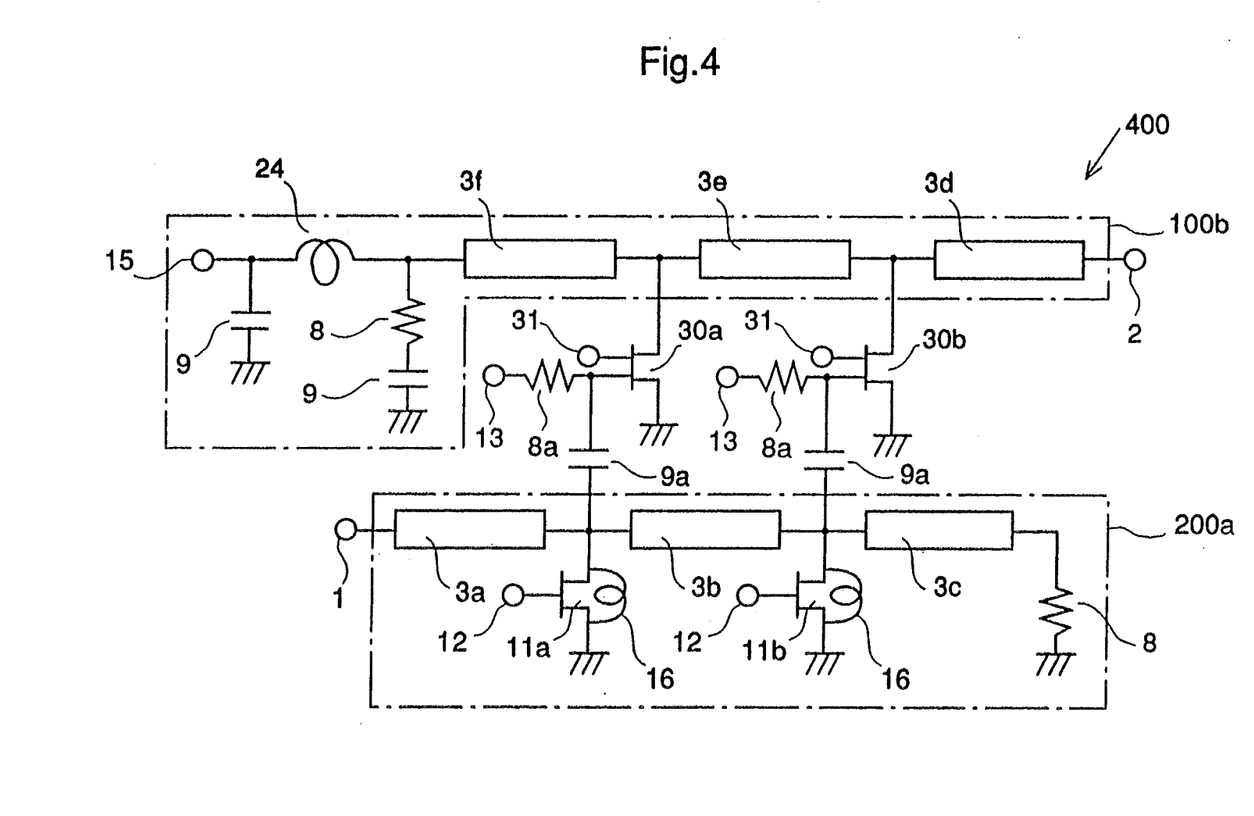
FIG. 4 is a circuit diagram illustrating a distributed amplifier in accordance with a fourth embodiment of the present invention.

FIG. 4 is a circuit diagram illustrating a distributed amplifier in accordance with a fourth embodiment of the present invention. In FIG. 4, the same reference numerals as those in FIGS. 2 and 3 designate the same or corresponding parts. A distributed amplifier 400 according to this fourth embodiment is fundamentally identical to the distributed amplifier 300 of the third embodiment except that the input side circuit 200a of the second embodiment shown in FIG. 2 is employed in place of the input side circuit 100a.

The distributed amplifier 400 of this fourth embodiment provides the same effects as described in the third embodiment. In addition, the amplifier 400 can be used in a narrower band than the distributed amplifier 300 of the third embodiment.

Figure 5:
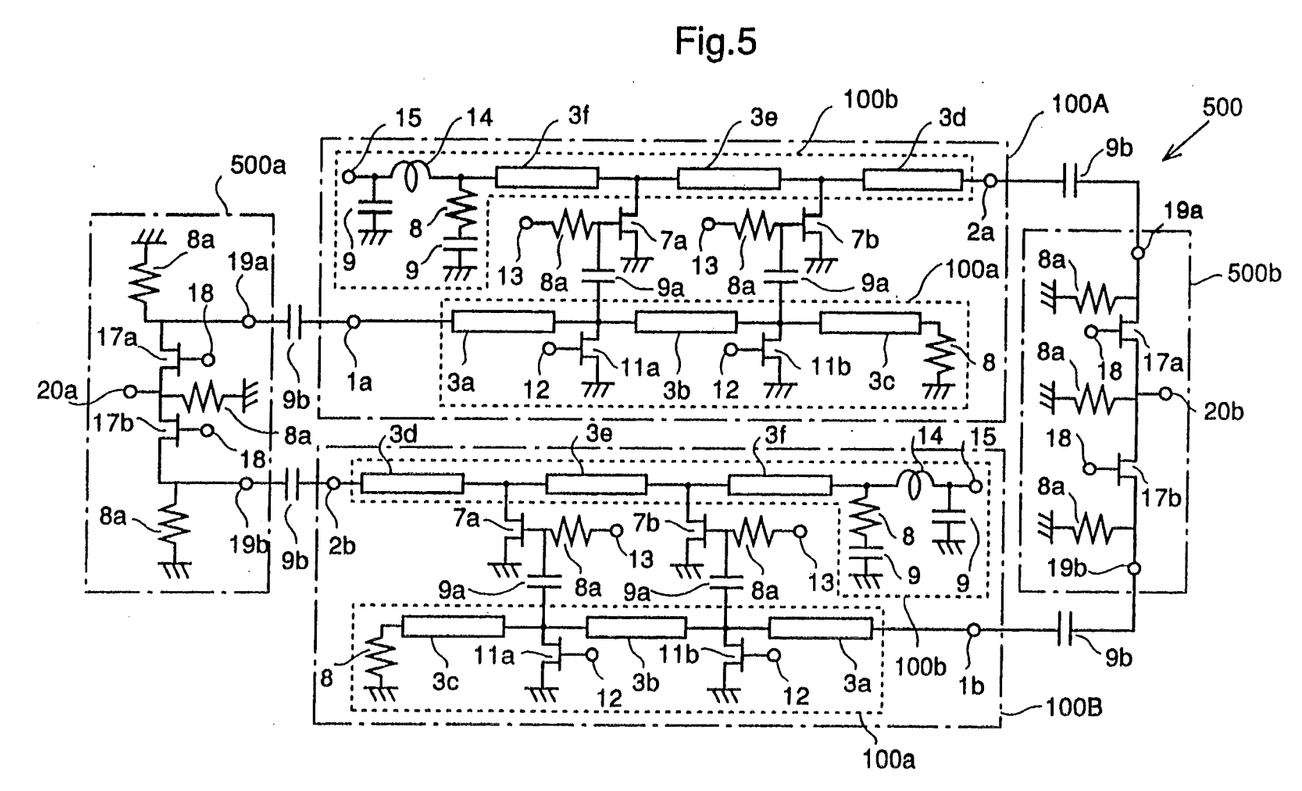
FIG. 5 is a circuit diagram illustrating a bidirectional amplifier in accordance with a fifth embodiment of the present invention.

FIG. 5 is a circuit diagram illustrating a bidirectional amplifier in accordance with a fifth embodiment of the present invention. In the figure, the same reference numerals as in FIG. 1 designate the same or corresponding parts. In this fifth embodiment, a bidirectional amplifier 500 comprises two distributed amplifiers 100A and 100B having the same structure as the distributed amplifier 100 according to the first embodiment, and two SPDT (Single Pole Double Throw) switches 500a and 500b each comprising two FETs 17a and 17b. An input terminal 1a of the distributed amplifier 100A is connected to a first terminal 19a of the SPDT switch 500a via a capacitor 9b, and an output terminal 2b of the distributed amplifier 100B is connected to a second terminal 19b of the SPDT switch 500a via a capacitor 9b. An output terminal 2a of the distributed amplifier 100A is connected to a first terminal 19a of the SPDT switch 500b via a capacitor 9b, and an input terminal 1b of the distributed amplifier 100B is connected to a second terminal 19b of the SPDT switch 500b via a capacitor 9b.

Reference numerals 20a and 20b designate signal input-output terminals of the SPDT switches 500a and 500b, respectively, and numerals 17a and 17b designate FETs included in each SPDT switch. The junction of the FETs 17a and 17b, and sources of these FETs are connected to ground via resistors 8a. Reference numeral 18 designates a gate bias terminal for controlling switching.

A description is given of the operation.

First of all, the FETs 17a of the SPDT switches 500a and 500b are turned on and the FETs 17b of these switches are turned off by the switching control gate bias applied to the terminals 18. The source-grounded FETs 11a and 11b of the input side circuit 100a of the distributed amplifier 100A are turned off by the gate bias applied thereto, i.e., the distributed switch is turned on, and, on the contrary, the source-grounded FETs 11a and 11b of the input side circuit 110a of the distributed amplifier 100B are turned on by the gate bias applied thereto, i.e., the distributed switch is turned off. Further, 0 V is applied to the drain bias terminal 15 of the distributed amplifier 100B to enable the FETs 7a and 7b of the distributed amplifier 100B to perform the switching operation. A bias voltage to turn on the FETs 7a and 7b is applied to the gate bias terminals 13 of the FETs 7a and 7b to turn off the distributed constant lines 3d, 3e, and 3f connected to the input-output terminal 20a.

In this case, a signal is input to the input-output terminal 20a of the SPDT switch 500a from the outside, amplified in the distributed amplifier 100A, and output from the input-output terminal 20b of the SPDT switch 500b.

On the other hand, if the ON and OFF states of the respective FETs included in the distributed amplifiers 100A and 100B and the respective FETs included in the SPDT switches 500a and 500b are contrary to those described above, i.e., if those in the ON STATE are in the OFF STATE and those in the OFF STATE are in the ON STATE, a signal input to the input-output terminal 20b of the SPDT switch 500b from the outside is amplified in the distributed amplifier 100B. The amplified signal is output from the input-output terminal 20a of the SPDT switch 500b.

As described above, the bidirectional amplifier 500 according to the fifth embodiment of the present invention does not require a supplemental distributed switch between the distributed amplifiers and the SPDT switches for preventing an adverse effect of the in one of the distributed amplifiers through which no signal is transmitted to the other distributed amplifier through which signal is transmitted. Therefore, the bidirectional amplifier 500 is fabricated using only two distributed amplifiers and two SPDT switches, resulting in a reduction in the chip size compared to the conventional bidirectional amplifier.

Figure 6:
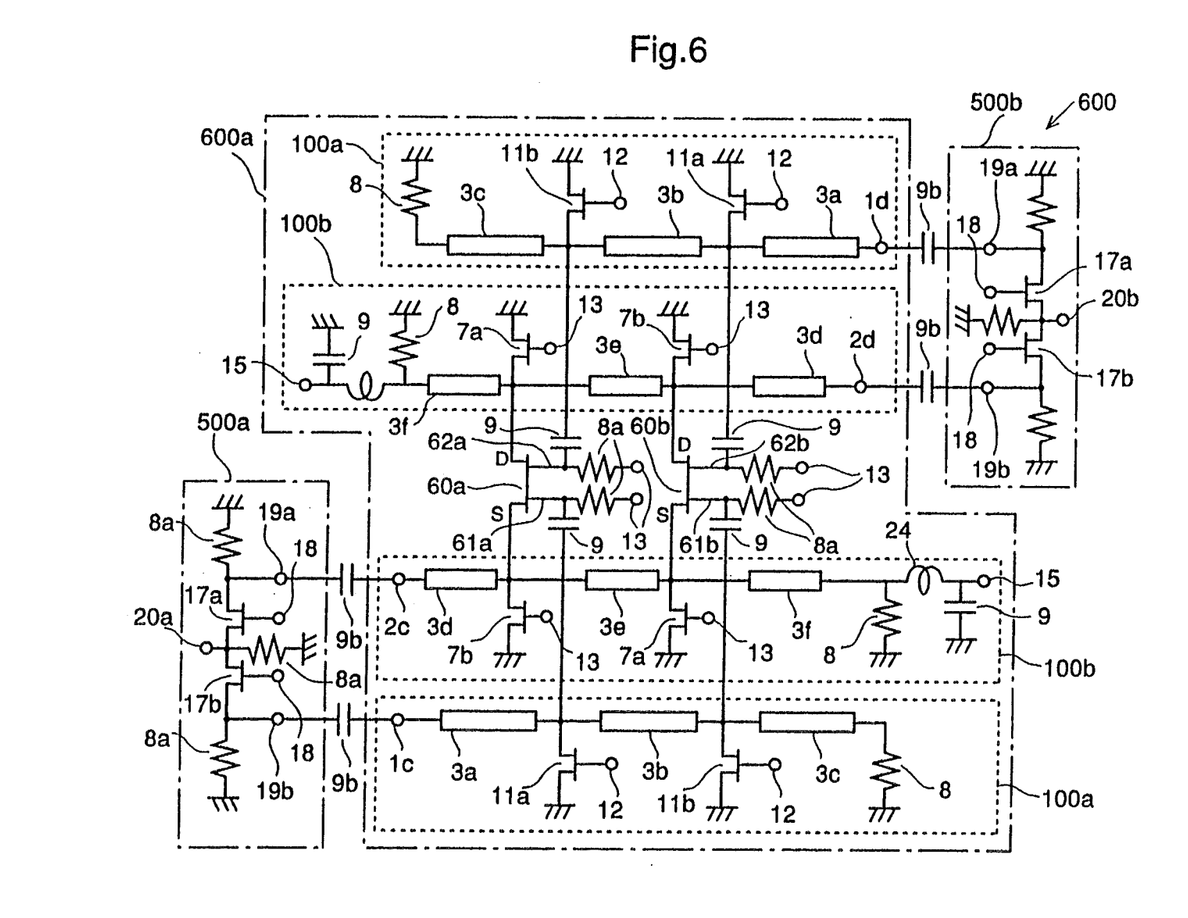
FIG. 6 is a circuit diagram illustrating a bidirectional amplifier in accordance with a sixth embodiment of the present invention.

FIG. 6 is a circuit diagram illustrating a bidirectional amplifier in accordance with a sixth embodiment of the present invention. In FIG. 6, the same reference numerals as in FIGS. 1 and 5 designate the same or corresponding parts. A bidirectional amplifier 600 of this sixth embodiment comprises a distributed amplifier 600a including dual gate FETs 60a and 60b as amplifier FETs and two SPDT switches 500a and 500b each including two FETs 17a and 17b. In the distributed amplifier 600a, first gates 61a and 61b and second gates 62a and 62b of the respective dual gate FETs 60a and 60b are connected to the input side circuits 100a shown in FIG. 1 via capacitors 9, and sources and drains of the respective dual gate FETs 60a and 60b are connected to the output side circuits 100b shown in FIG. 1. A first terminal 19a of the SPDT switch 500a is connected through a capacitor 9a to an output terminal 2c of the output side circuit 100b which is connected to the sources of the dual gate FETs 60a and 60b, and a second terminal 19b of the SPDT switch 500a is connected through a capacitor 9b to an input terminal 1c of the input side circuit 100a which is connected to the first gates 61a and 61b of the dual gate FETs 60a and 60b. A first terminal 19a of the SPDT switch 500b is connected through a capacitor 9b to an input terminal 1d of the input side circuit 100a which is connected to the second gates 62a and 62b of the dual gate FETs 60a and 60b, and a second terminal 19b of the SPDT switch 500b is connected through a capacitor 9b to an output terminal 2d of the output side circuit 100b which is connected to the drains of the dual gate FETs 60a and 60b.

A description is given of the operation.

First of all, the FETs 17a of the SPDT switches 500a and 500b are turned off and the FETs 17b of these switches are turned on by the switching control gate bias applied to the terminals 18. In addition, the source-grounded FETs 11a and 11b of the input side circuit 100a connected to the first gates 61a and 61b are turned off by a gate bias applied thereto, i.e., the distributed switch is turned on, and, on the contrary, the source-grounded FETs 11a and 11b of the input side circuit 100a connected to the second gates 62a and 62b are turned on by a gate bias applied thereto, i.e., the distributed switch is turned off.

Further, 0 V is applied to the drain bias terminal 15 of the output side circuit 100b which is connected to the sources of the dual gate FETs 60a and 60b to enable the FETs 7a and 7b of the output side circuits 100b to perform the switching operation, and a bias voltage to turn on the FETs 7a and 7b is applied to the gate bias terminals 13 of these FETs 7a and 7b to turn off the distributed constant lines 3d, 3e, and 3f of the output side circuit 100b.

In this case, a signal is input to the input-output terminal 20a of the SPDT switch 500a from the outside, amplified in the input side circuit 100a connected to the first gates 61a and 61b and in the output side circuit 100b connected to the drains of the dual gate FETs, and output from the input-output terminal 20b of the SPDT switch 500b.

On the other hand, if the ON and OFF states of the respective FETs of the distributed amplifier 600a and the respective FETs of the first and second SPDT switches 500a and 500b are contrary to those described above, i.e., if those in the ON STATE are in the OFF STATE and those in the OFF STATE are in the ON STATE, a signal is input to the input-output terminal 20b of the SPDT switch 500b from the outside and amplified in the input side circuit 100a connected to the second gates 62a and 62b of the dual gate FETs 60a and 60b and in the output side circuit 100b connected to the sources of the dual gate FETs. The amplified signal is output from the input-output terminal 20a of the SPDT switch 500b.

The bidirectional amplifier 600 according to the sixth embodiment of the present invention achieves the same amplification as that of the bidirectional amplifier 500 according to the fifth embodiment with the same effects as described above.

While in the above-described first to sixth embodiments the distributed amplifier includes two amplifier FETs, it may include three or more amplifier FETs with the same effects as described above.

What is claimed is:

1. A distributed amplifier comprising:
   an input side circuit including a plurality of distributed constant lines connected in series between an input terminal and ground, and a plurality of source-grounded FETs for switching operation, each source-grounded FET for switching having a drain connected to a respective junction of said distributed constant lines;
   an output side circuit including a plurality of distributed constant lines connected in series between an output terminal and ground; and
   a plurality of source-grounded amplifier FETs, each amplifier FET having a gate connected to a respective junction of said distributed constant lines of said input side circuit via a capacitor and a drain connected to a respective junction of said distributed constant lines of said output side circuit.

2. The distributed amplifier of claim 1 wherein said capacitors and said source-grounded FETs for switching satisfy the following relationships:

$$50\Omega = \sqrt{\frac{L_g}{\frac{C_{gs} \cdot C}{C_{gs} + C} + C_T}}$$

$$\frac{C_{gs} \cdot C}{C_{gs} + C} \gg C_T$$

where Lg is input side circuit inductance, Cgs is gate-to-source capacitance of each of said source-grounded FETs for switching operation, CT is capacitance each of said source-grounded FETs for switching operation in the OFF state, and C is the capacitance of each of said capacitors.

3. The distributed amplifier of claim 1 including an inductor connected across the source and drain of each of said source-grounded FETs for switching operation.

4. The distributed amplifier of claim 2 including an inductor connected across the source and drain of each of said source-grounded FETs for switching operation.

5. The distributed amplifier of claim 1 wherein said amplifier FETs are dual gate FETs each having two gates.

6. The distributed amplifier of claim 2 wherein said amplifier FETs are dual gate FETs each having two gates.

7. A bidirectional amplifier comprising:

first and second distributed amplifiers, each distributed amplifier comprising an input side circuit including a plurality of distributed constant lines connected in series between an input terminal and ground, and a plurality of source-grounded FETs for switching operation, each source-grounded FET for switching having a drain connected to a respective junction of said distributed constant lines, an output side circuit including a plurality of distributed constant lines connected in series between an output terminal and ground, and a plurality of source-grounded amplifier FETs, each amplifier FET having a gate connected to a respective junction of said distributed constant lines of said input side circuit via a capacitor and a drain connected to a respective junction of said distributed constant lines of said output side circuit; and first and second SPDT (Single Pole Double Throw) switches, each SPDT switch having first, second, and third terminals, wherein an input signal applied to said first terminal is output from one of said second and third terminals, and one of two input signals respectively applied to said second and third terminals is output from said first terminals said second terminal of said first SPDT switch being connected to an input terminal of said first distributed amplifier and said third terminal of said first SPDT switch being connected to an output terminal of said second distributed amplifier, said second terminal of said second SPDT switch being connected to an output terminal of said first distributed amplifier and said third terminal of said second SPDT switch being connected to an input terminal of said second distributed amplifier, said first terminals of said first and second SPDT switches being input-output terminals of said directional amplifier.

8. A bidirectional amplifier comprising:

a distributed amplifier comprising first and second input side circuits, each input side circuit, comprising a plurality of distributed constant lines connected in series between an input terminal and ground, and a plurality of source-grounded FETs for switching operation, each source-grounded FET having a drain connected to a respective junction of said distributed constant lines; first and second output side circuits, each output side circuit comprising a plurality of distributed constant lines connected in series between an output terminal and ground, and a plurality of dual gate FETs for amplification, each dual gate FET having first and second gates, a source, and a drain, said first gate being connected through a capacitor to a respective junction of said distributed constant lines of said first input side circuit and said second gate being connected through a capacitor to a respective junction of said distributed constant lines of said second input side circuit, and one of said source and drain being connected to a respective junction of said distributed constant lines of said first output side circuit and the other of said source and drain being connected to a respective junction of said distributed constant lines of said second output side circuit;

first and second Single Pole Double Throw (SPDT) switches, each SPDT switch having first, second, and third terminals, wherein an input signal applied to said first terminal is output from one of said second and third terminals, and one of two input signals respectively applied to said second and third terminals is output from said first terminals said second terminal of said first SPDT switch being connected to an input terminal of said first input side circuit and said third terminal of said first SPDT switch being connected to an output terminal of said first output side circuits said second terminal of said second SPDT switch being connected to an input terminal of said second input side circuit and said third terminal of said second SPDT switch being connected to an output terminal of said second output side circuits and said first terminals of said first and second SPDT switches being input-output terminals of said bidirectional amplifier.

9. The bidirectional amplifier of claim 7 comprising a drain bias terminal for controlling a drain bias applied to each amplifier FET included in said output side circuit.

10. The bidirectional amplifier of claim 8 comprising a drain bias terminal for controlling a drain bias applied to each amplifier FET included in said output side circuit.

11. The bidirectional amplifier of claim 7 wherein said source-grounded FETs for switching operation and said capacitors satisfy the following relationships $$50\Omega = \sqrt{\frac{Lg}{\frac{Cgs \cdot C}{Cgs + C} + CT}}$$

$$\frac{Cgs \cdot C}{Cgs + C} >> CT$$

where Lg is input side circuit inductance, Cgs is gate-to-source capacitance of each of said source-grounded FETs for switching operation, CT is capacitance each of said source-grounded FETs for switching operation in the OFF state, and C is the capacitance of each of said capacitors.

12. The bidirectional amplifier of claim 8 wherein said source-grounded FETs for switching operation and said capacitors satisfy the following relationships $$50\Omega = \sqrt{\frac{Lg}{\frac{Cgs \cdot C}{Cgs + C} + CT}}$$

-continued
$$\frac{C_{gs} \cdot C}{C_{gs} + C} >> C_T$$

where Lg is input side circuit inductance, Cgs is gate-to-source capacitance of each of said source-grounded FETs for switching operation, CT is capacitance each of said source-grounded FETs for switching operation in the OFF state, and C is the capacitance of each of said capacitors.

* * * * *

UNITED STATES PATENT AND TRADEMARK OFFICE
CERTIFICATE OF CORRECTION

PATENT NO. : 5,414,387
DATED : May 9, 1995
INVENTOR(S) : Nakahara et al.

It is certified that error appears in the above-indentified patent and that said Letters Patent is hereby corrected as shown below:

Column 9, Line 43, change "terminals" (second occurrence) to --terminal,--;

Line 59, delete "," (second occurrence).

Column 10, Line 22, change "terminals" (second occurrence) to --terminal,--;

Line 27, change "circuits" to --circuit,--;

Line 32, change "circuits" to --circuit,--.

Signed and Sealed this

First Day of August, 1995

*Attest:*

BRUCE LEHMAN

*Attesting Officer*    *Commissioner of Patents and Trademarks*